(12) United States Patent
Brodsky

(10) Patent No.: US 7,390,616 B2
(45) Date of Patent: Jun. 24, 2008

(54) METHOD FOR POST LITHOGRAPHIC CRITICAL DIMENSION SHRINKING USING POST OVERCOAT PLANARIZATION

(75) Inventor: Colin J. Brodsky, Salt Point, NY (US)

(73) Assignee: International Business Machines Corporation, Armonk, NY (US)

(*) Notice: Subject to any disclaimer, the term of this patent is extended or adjusted under 35 U.S.C. 154(b) by 585 days.

(21) Appl. No.: 10/905,581

(22) Filed: Jan. 12, 2005

(65) Prior Publication Data

US 2006/0154182 A1 Jul. 13, 2006

(51) Int. Cl.
  *G03F 7/26* (2006.01)
(52) U.S. Cl. .......................... 430/314; 430/311
(58) Field of Classification Search ........... 430/311, 430/314, 322, 324, 325, 330
  See application file for complete search history.

(56) References Cited

U.S. PATENT DOCUMENTS

| | | | |
|---|---|---|---|
| 6,117,622 A | 9/2000 | Eisele et al. | |
| 6,274,289 B1 | 8/2001 | Subramanian et al. | |
| 6,383,952 B1 | 5/2002 | Subramanian et al. | |
| 6,486,058 B1 | 11/2002 | Chun | |
| 6,492,075 B1 | 12/2002 | Templeton et al. | |
| 6,534,243 B1 | 3/2003 | Templeton et al. | |
| 6,642,148 B1 | 11/2003 | Ghandehari et al. | |
| 6,703,323 B2 | 3/2004 | Kong et al. | |
| 6,764,946 B1 | 7/2004 | Amblard | |
| 2002/0102785 A1 | 8/2002 | Ho et al. | |
| 2002/0167838 A1 | 11/2002 | Perner | |
| 2003/0107920 A1 | 6/2003 | Roohparvar | |
| 2003/0128589 A1 | 7/2003 | Roohparvar | |
| 2003/0143489 A1 | 7/2003 | Kong et al. | |
| 2003/0203320 A1 | 10/2003 | Sabnis et al. | |
| 2004/0001364 A1 | 1/2004 | Bhatia et al. | |
| 2005/0130067 A1* | 6/2005 | Endo et al. ............... | 430/311 |

OTHER PUBLICATIONS

Karen Petrillo et al.; "Methods for Comparing Contact Hole Shrinking Techniques with 248 nm Single Layer and Bilayer Photoresists;" Proc. SPIE, vol. 4690, pp. 741-753, Advances in Resist Technology and Processing XIX Jul. 2002.

\* cited by examiner

*Primary Examiner*—Kathleen Duda
(74) *Attorney, Agent, or Firm*—Cantor Colburn LLP; Steven Capella

(57) ABSTRACT

A method for post lithographic critical dimension shrinking of a patterned semiconductor feature includes forming an overcoat layer over a patterned photoresist layer, and removing portions of the overcoat layer initially formed over top surfaces of the patterned photoresist layer. The remaining portions of the overcoat layer on sidewalls of said patterned photoresist layer are reacted so as to chemically bind the remaining portions of the overcoat layer on the sidewalls.

19 Claims, 5 Drawing Sheets

METHOD FOR POST LITHOGRAPHIC CRITICAL DIMENSION SHRINKING USING POST OVERCOAT PLANARIZATION

BACKGROUND OF THE INVENTION

The present invention relates generally to semiconductor device manufacturing, and, more particularly, to a method for post lithographic critical dimension shrinking including post overcoat planarization.

The fabrication of integrated circuits on a semiconductor substrate typically includes multiple photolithography steps. A photolithography process begins by applying a thin layer of a photoresist material to the substrate surface. The photoresist is then exposed through a photolithography exposure tool to a radiation source that changes the solubility of the photoresist at areas exposed to the radiation. The photolithography exposure tool typically includes transparent regions that do not interact with the exposing radiation and a patterned material or materials that do interact with the exposing radiation, either to block it or to shift its phase.

As each successive generation of integrated circuits crowds more circuit elements onto the semiconductor substrate, it becomes necessary to reduce the size of the features, i.e., the lines and spaces that make up the circuit elements. The minimum feature size that can be accurately produced on a substrate is limited by the ability of the fabrication process to form an undistorted optical image of the mask pattern onto the substrate, by the chemical and physical interaction of the photoresist with the developer, and by the uniformity of the subsequent process (e.g., etching or diffusion) that uses the patterned photoresist.

Advanced lithography for formation of structures such as contact holes has become increasingly reliant on "shrink" methods in which a contact hole is imaged at a critical dimension (CD) larger than the target dimension, and is thereafter reduced to the target dimension through some post-lithography process. Many different processes are under development/exploration by resist vendors, as well as device manufacturers, using a wide range of techniques including reflow, etch tapering in intermediate layers, and overcoats that bind to the existing pattern with finite thickness. Although no clear front-runner has emerged in this relatively immature technology field, overcoat-based techniques offer certain fundamental advantages among litho-based techniques. More specifically, they offer the least opportunity for uncontrolled distortion of the lithographic image during the shrink (as compared to purely thermal reflow processes, for example) and have the best potential to offer consistent CD shrinks within the contact, regardless of pattern density.

Overcoat based chemical shrinks typically rely on an interaction with the already imaged resist material, wherein a new film is spin cast such that both materials fill in and overcoat the previously imaged material with a finite thickness. For example, in some common schemes, residual acid in the resist is used to catalyze a reaction with the overcoat material that crosslinks a controlled thickness of the overcoat both within the contact hole and on top of the resist surface. However, while this effect works relatively well along a straight edge, the diffusion behavior is much less ideal around a sharp corner of the feature. It is well known that degradation around top corners of lithographically imaged features contributes to uncontrolled variation in subsequent etch processing. Accordingly, it would be desirable to be able to improve this type of shrink process for corner features.

SUMMARY OF THE INVENTION

The foregoing discussed drawbacks and deficiencies of the prior art are overcome or alleviated by a method for post lithographic critical dimension shrinking of a patterned semiconductor feature. In an exemplary embodiment, the method includes forming an overcoat layer over a patterned photoresist layer, and removing portions of the overcoat layer initially formed over top surfaces of the patterned photoresist layer. The remaining portions of the overcoat layer on sidewalls of the patterned photoresist layer are reacted so as to chemically bind the remaining portions of the overcoat layer on the sidewalls.

In another embodiment, a method for post lithographic critical dimension shrinking of a patterned semiconductor feature includes implementing an initial process setup procedure, including determining a thickness of a test overcoat layer, and determining a removal rate of the test overcoat layer. One or more manufacturing processes are implemented subsequent to the initial process setup procedure, further including forming an overcoat layer over a patterned photoresist layer, and removing portions of the overcoat layer initially formed over top surfaces of the patterned photoresist layer. Remaining portions of the overcoat layer on sidewalls of the patterned photoresist layer are reacted so as to chemically bind the remaining portions of said overcoat layer on the sidewalls.

BRIEF DESCRIPTION OF THE DRAWINGS

Referring to the exemplary drawings wherein like elements are numbered alike in the several Figures.

DETAILED DESCRIPTION OF THE INVENTION

Disclosed herein is a method for post lithographic critical dimension shrinking using post overcoat planarization, such that an applied overcoat is removed (e.g., etched, polished) back to the top surface of the unexposed resist, while remaining on the sidewalls thereof. In so doing, the planarization of the overcoat applied in chemical shrink strategies will eliminate top corner rounding by providing a more consistent diffusion environment around the full height of the contact hole image.

Referring initially to FIGS. 1(a) through 1(e), there is shown an exemplary process flow sequence in which an overcoat chemical shrink is applied to a resist-patterned area in a conventional manner. As particularly shown in FIG. 1(a), a substrate 102 has a photoresist material 104 formed thereupon, and has been patterned/developed to form a contact opening 106. As indicated previously, the opening 106 is initially larger than desired, due to resolution issues with the imaging equipment. Although the substrate 102 may generally represent any formed layer in a semiconductor process, the exemplary processing step is particularly suited for contact and via processing, where patterned features are sought to be shrunk following the initial resist exposure and one critical dimension predominates. Via processing in back end of line (BEOL) processing has many more layers and would represent another suitable candidate for the present process.

Figure 1A:
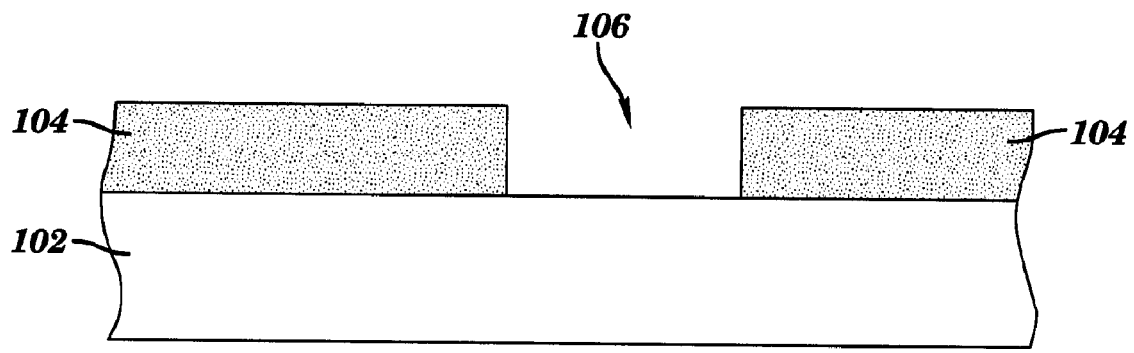
FIGS. 1(a) through 1(e) illustrate an exemplary process flow sequence in which an overcoat chemical shrink is applied to a resist-patterned area in a conventional manner.
Figure 1B:
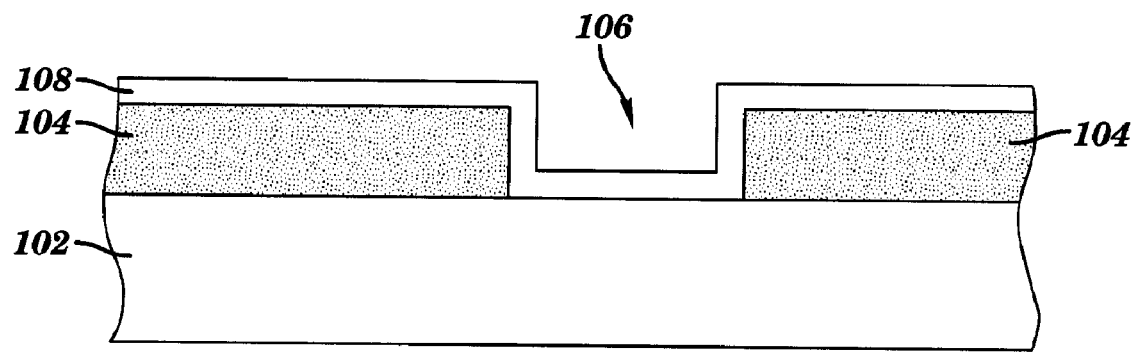
Figure 1C:
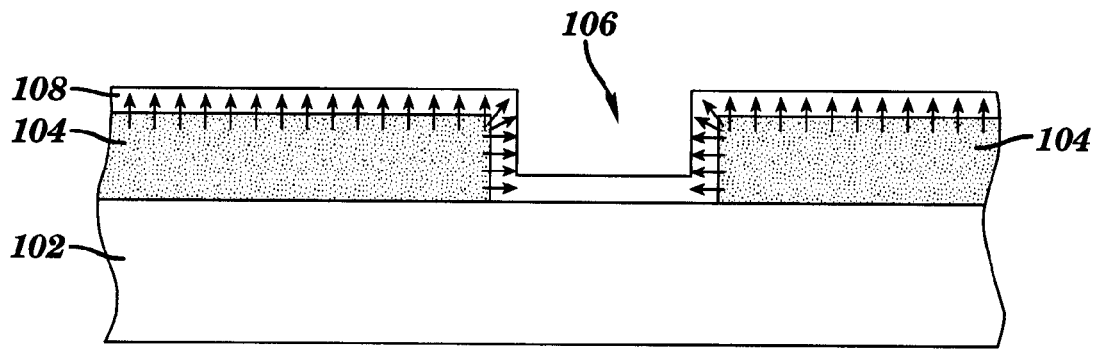

The application of the overcoat material 108 is shown in FIG. 1(b). The overcoat material 108 is a material that is selected to catalyze a reaction with residual acid in the resist material 104, thus effectively increasing the effective resist thickness for a subsequent etching step. For example, the overcoat material may be any of the well-known RELACS™ (Resolution Enhancement Lithography Assisted by Chemical Shrink) materials available from Clariant Corporation. It will be noted that the applied overcoat material 108 generally coats the top surface and sidewalls of the resist material 104, as well as the exposed surfaces of the substrate 102 in a uniform manner. The overcoat may be either generally conformal, as shown, or it may planarize and fill the contact holes (e.g., opening 106). FIG. 1(c) illustrates a subsequent diffusion-driven intermixing step to produce the desired reaction between the overcoat material 108 and the residual acid in the resist material 104. The outward diffusion of the residual acid is indicated by the arrows in FIG. 1(c). It should be noted that for purposes of the present description and the embodiments described hereinafter, the material (e.g., substrate 102) underlying the resist 104 neither accepts or contributes any acid to the overcoat material 108 and can thus be treated as an impermeable slab with respect to the resist reaction.

Figure 1D:
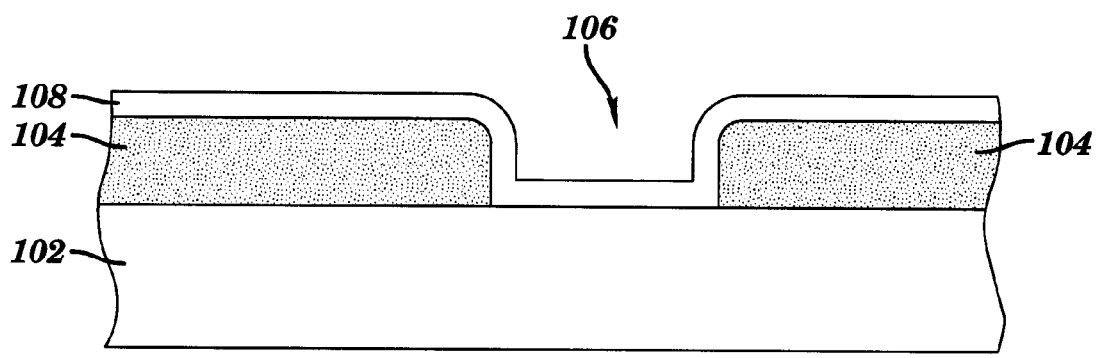
Figure 1E:
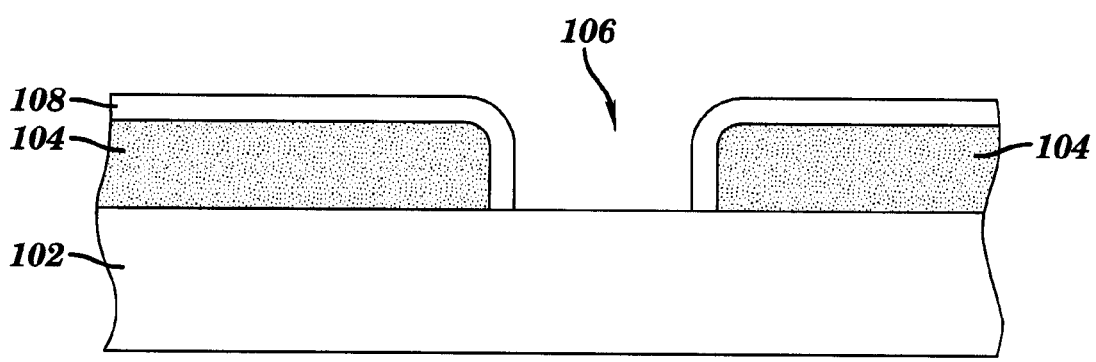

It will further be noted, however, that at the corner regions of the patterned resist material 104 (indicated in the circled regions) the sharp corner definition of the resist 104 degrades due to diffusion/mixing in two dimensions. As a result, the corner regions of the resist 104 and reacted overcoat material 108 become rounded, as shown in FIG. 1(d). Following the reaction, the unreacted portions of the overcoat material 108 are removed by rinsing, for example, as shown in FIG. 1(e). As the effective thickness of the resist 104 has now been increased, the size of the opening 106 is reduced so as to more closely approximated the target dimension for contact hole formation.

Unfortunately, the resulting rounded profile is not desirable for post-lithographic processing, as indicated earlier. In particular, it has been determined that the degraded corner profile becomes a hindrance as it can contribute to poor etch control. By both filling the contact hole, as well as leaving a topcoat of material with finite thickness above the contact hole, concentration-gradient driven diffusion processes will inherently lead to a degraded and rounded profile in this region.

Figure 2:
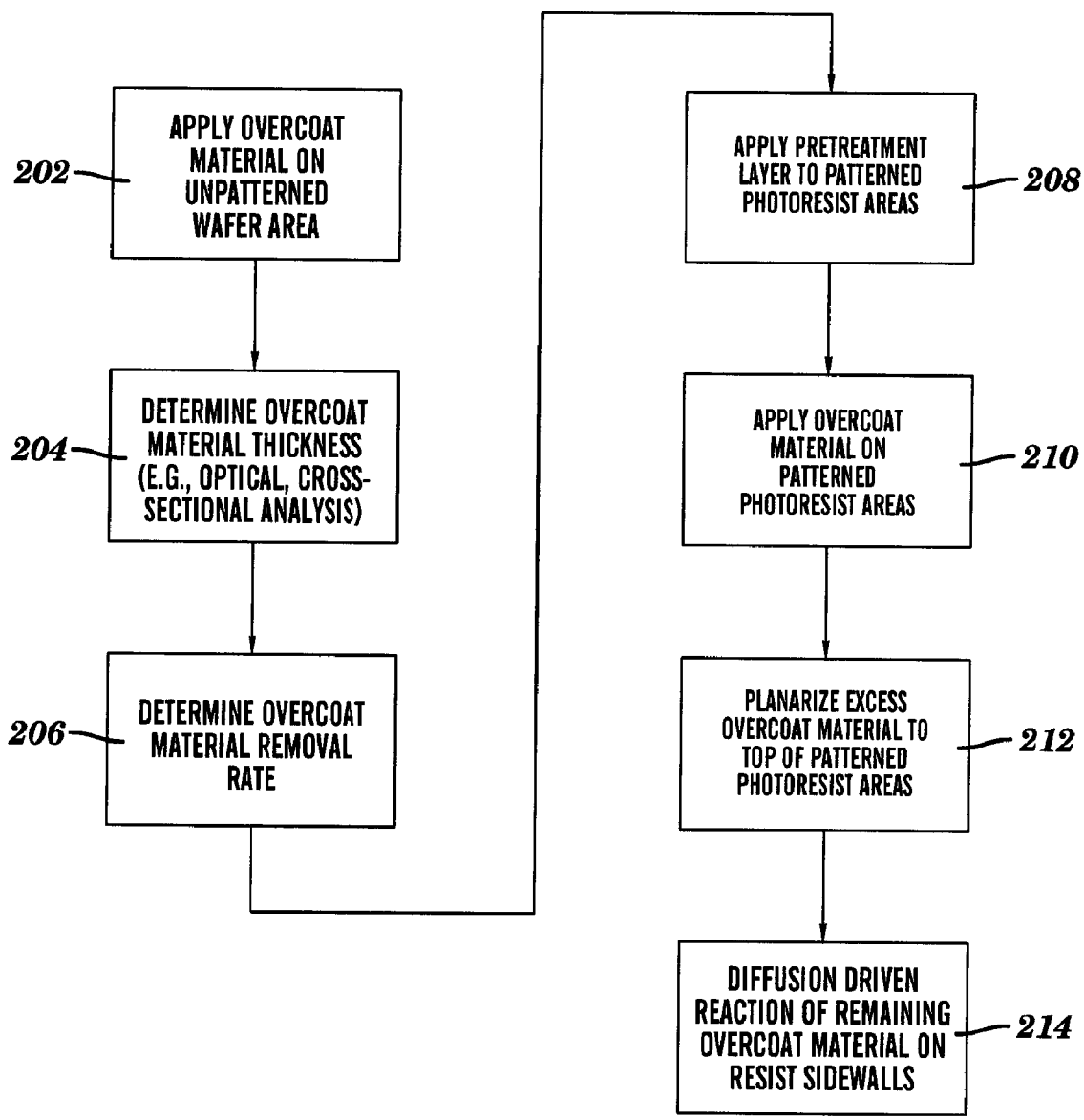
FIG. 2 is a process flow diagram illustrating a method for post lithographic critical dimension shrinking, in accordance with an embodiment of the invention.
Figure 3A:
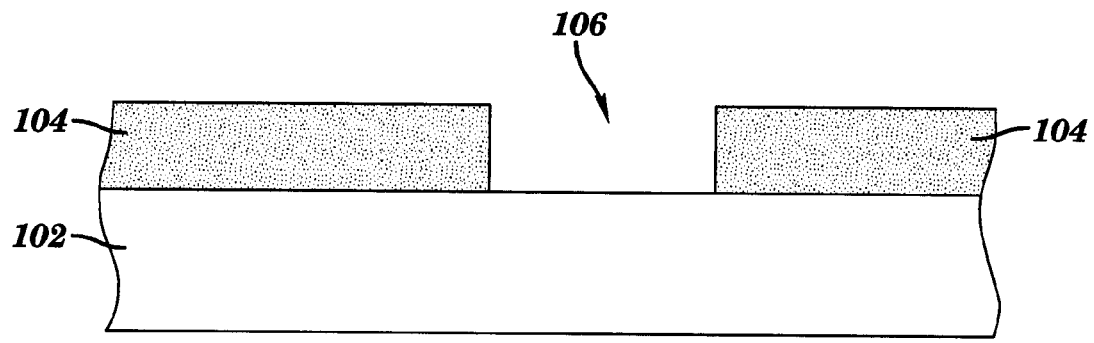
FIGS. 3(a) through 3(e) are cross sectional views particularly illustrating the overcoat formation and planarization steps outlined in FIG. 2.
Figure 3B:
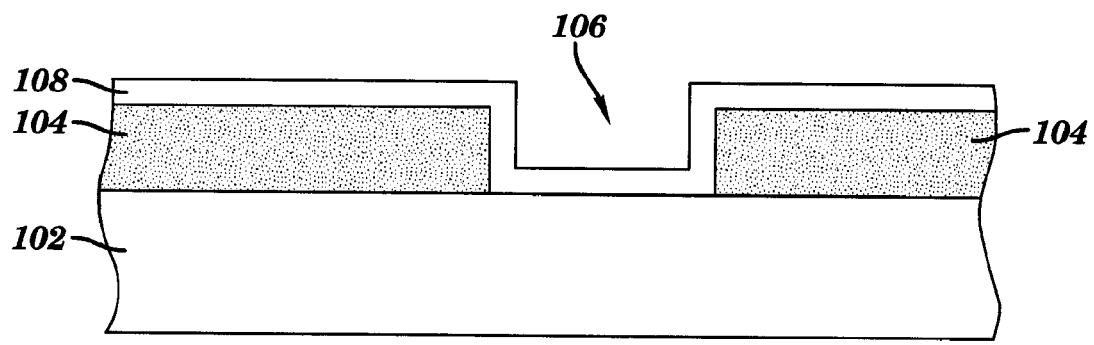
Figure 3C:
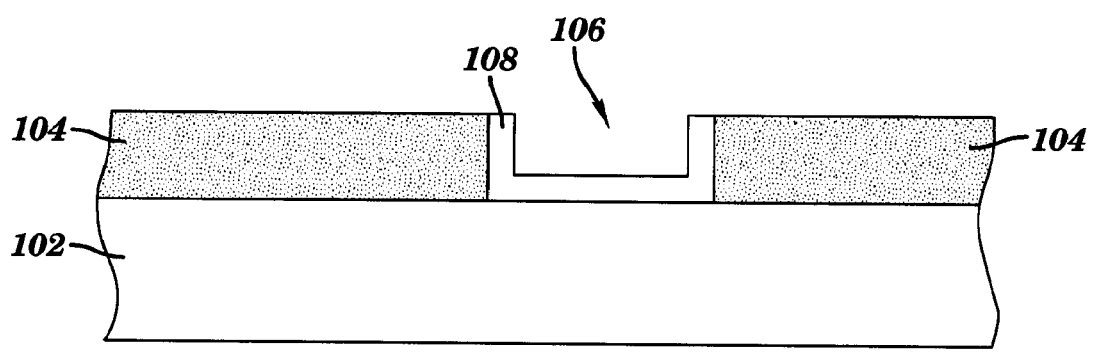
Figure 3D:
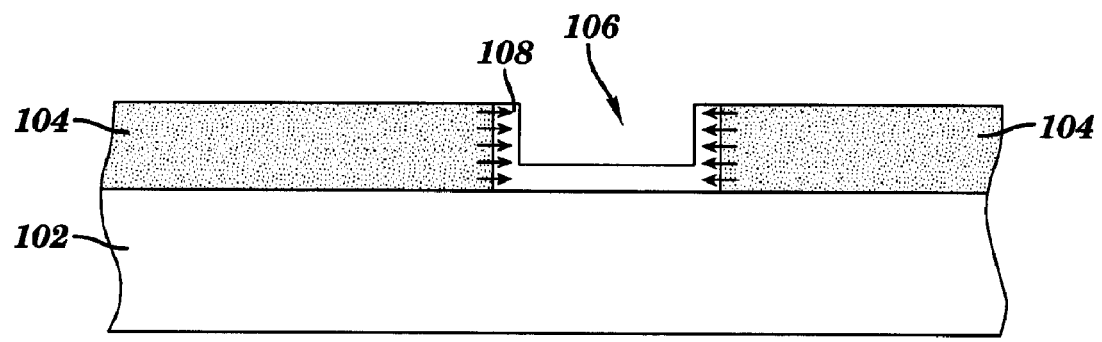
Figure 3E:
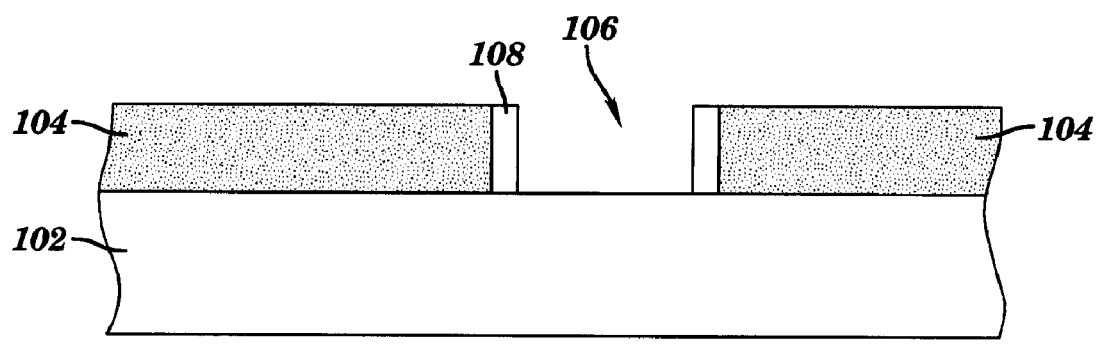

Therefore, in accordance with an embodiment of the invention, FIG. 2 is a process flow diagram 200 illustrating a method for post lithographic critical dimension shrinking, in which the problem of corner rounding is eliminated. Initially, a process setup sub procedure is implemented to determine the thickness of an applied overcoat material, such as applied by spin-on techniques. As this type of layer is highly planarized after application, the thickness thereof is generally consistent from wafer-to-wafer. Accordingly, in block 202, a test overcoat material is applied on an unpatterned area of a wafer. Because this is part of the overall process setup procedure, the application may be carried out in wafer areas that do not contain contact holes (e.g., by using either a blanket coated wafer or a moderately sized area without contact holes on a patterned wafer). The test overcoat material may be a water-based spin on material, such as the RELACS materials described above. Alternatively, a solvent-based overcoat material may also be spin cast onto the wafer.

Then, as shown in block 204, the thickness of the test overcoat material is determined to provide an indication of the excess thickness that will be present once actually applied to patterned photoresist. The thickness determination may be carried out, for example, by a simple reflectivity or ellipsometric measurement. Alternatively, the thickness could be determined by a cross-sectional technique such as scanning electron microscopy (SEM) analysis or atomic force microscopy (AFM) analysis, in which case you could look at either patterned areas or unpatterned areas may be viewed. Again, the test overcoat material thickness thus determined should be highly repeatable, as is the case with spin-coated photoresist.

Following the thickness determination, the rate of removal of the test overcoat material is then determined, as shown in block 206. In an exemplary embodiment, this may be carried out by subjecting the wafer to a timed blanket etch to remove the overcoat thickness. For example, in the context of a water-based spin on overcoat material (e.g., RELACS), a dry etch reactive ion etch (RIE) process could be used. On the other hand, for a solvent-based spin on overcoat material, a wet developer or other solvent stripping material may be utilized for removing the overcoat material in a controlled fashion. In any case, an endpoint may be timed (based on the known thickness) to remove the overcoat in conjunction with the etch rate, or via some other endpoint detection means such as analysis of RIE etch gas composition versus time or optical thickness analysis of the wafer film during develop/etch. A timed endpointing method is preferable for purposes of simplicity.

It should be noted that provided the etch rate of the test overcoat material is well matched to the photoresist etch rate, one could set the endpoint to perform an overetch to incrementally break through the unexposed resist and ensure complete and thorough removal of the overcoat in areas outside the contact holes.

It will further be noted that the above described overcoat removal rate determination shown in block 206 is particularly suited for an etch-based approach to overcoat removal. However, it is contemplated that the actual removal mechanism of the overcoat material during the critical dimension shrink process could also be through chemical-mechanical planarization/polishing (CMP), particular if the CMP steps are designed to be selective between overcoat and resist.

After completion of the process setup steps, the method proceeds to block 208, where a pretreatment layer is optionally applied to the actual patterned photoresist areas (having patterned features, e.g., contact holes, greater than the target dimension). The pretreatment layer is characterized by a solution designed to deposit a catalyzing material in the photoresist. For example, the photoresist surface may be treated with an acidic solution to enhance the subsequent polymerization of an overcoat layer applied thereon. This optional step may be desired upon recognition that such overcoat processes are sometimes catalyzed by residual acid photochemically generated during the exposure of the resist. In such cases, the acid tends to already be concentrated along the contact hole walls, which helps control the profile in a more ideal fashion. However, this can restrict the overcoat shrink process to be compatible with whatever materials are contained in the resist.

Regardless of whether a pretreatment layer is applied to the patterned resist, the method then proceeds to block 210 for the application of the overcoat material. The thickness of the layer is known as a result of the process setup steps discussed above. Then, as shown in block 212, the excess overcoat thickness (and pretreatment layer if applied) is planarized down to the top surfaces of the patterned resist. As indicated previously, this planarizing step may be implemented using a variety of techniques (e.g., timed etch, polishing), since the thickness of interest to be removed from the overcoat material is uniform in nature until the underlying resist material is reached.

In removing the excess overcoat (i.e., leaving the remaining overcoat material only on sidewall surfaces with respect to the patterned resist), any reactants intended to catalyze the binding of overcoat material to the contact hole sidewalls will preferentially diffuse in the direction of the contact hole (as opposed to the direction of the top surface of the resist). Finally, in block 214, a diffusion driven reaction causes the reaction of the remaining overcoat material on the resist sidewalls, thereby effectively shrinking the size of the patterned opening without compromising the sidewall integrity.

FIGS. 3(*a*) through 3(*e*) are cross sectional views particularly illustrating the overcoat formation and planarization steps discussed after block 208 above. The initial patterning of the resist material 104 and application of the overcoat material 108 as shown in FIGS. 3(*a*) and 3(*b*) generally correspond to the steps illustrated in FIGS. 1(*a*) and 1(*b*). Again, FIG. 3(*b*) shows a conformal deposition of the overcoat material 108, it should be understood that the overcoat material can also initially fill the contact opening 106. It is further noted that the optional pretreatment layer is not illustrated in FIGS. 3(*a*) and 3(*b*). As shown in FIG. 3(*c*), the overcoat material 108 has been removed from the top surfaces of the resist material 104, remaining only on the sidewall surfaces of the resist material 104 and the exposed areas of the substrate 102. In FIG. 3(*d*), the arrows illustrate the "one dimensional" diffusive reaction along the sidewalls of the resist material 104, to this provide a more uniform shrink sidewall without the top corner rounding of the existing approaches. The unreacted overcoat material on the substrate surface may then be rinsed off as shown in FIG. 3(*e*).

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for post lithographic critical dimension shrinking of a patterned semiconductor feature, the method comprising:
   spin coating a reactive overcoat layer over a patterned photoresist layer so as to form an initially reactive material on both top and sidewall surfaces of said patterned photoresist surface;
   completely removing portions of said reactive overcoat layer that are initially formed over top surfaces of said patterned photoresist layer prior to implementing a reaction thereof; and
   following said removing portions of said reactive overcoat layer that are initially formed over top surfaces of said patterned photoresist layer, reacting remaining portions of said overcoat layer on sidewalls of said patterned photoresist layer so as to chemically bind said remaining portions of said reactive overcoat layer on said sidewalls.

2. The method of claim 1, wherein said reactive overcoat layer comprises a material that is selected to catalyze a reaction with residual acid in said patterned photoresist layer.

3. The method of claim 2, further comprising forming a pretreatment layer over said patterned photoresist layer, prior to said forming said reactive overcoat layer, said pretreatment layer characterized by a solution for depositing a catalyzing material in said patterned photoresist layer.

4. The method of claim 3, wherein pretreatment layer comprises an acidic solution for enhancing a subsequent polymerization said reactive overcoat layer applied thereon.

5. The method of claim 1, wherein said removing portions of said reactive overcoat layer initially formed over top surfaces of said patterned photoresist layer further comprises planarizing said reactive overcoat layer to said top surfaces of said patterned photoresist layer.

6. The method of claim 5, wherein said planarizing comprises an endpoint timed etch.

7. The method of claim 5, wherein said planarizing comprises chemical mechanical polishing.

8. The method of claim 1, wherein said reacting remaining portions of said reactive overcoat layer further comprises a diffusion driven reaction.

9. A method for post lithographic critical dimension shrinking of a patterned semiconductor feature, the method comprising:
   implementing an initial process setup procedure, comprising determining a thickness of a test overcoat layer, and determining a removal rate of said test overcoat layer; and
   implementing one or more manufacturing processes subsequent to said initial process setup procedure, further comprising:
   spin coating a reactive overcoat layer over a patterned photoresist layer so as to form an initially reactive material on both top and sidewall surfaces of said patterned photoresist surface;
   completely removing portions of said reactive overcoat layer that are initially formed over top surfaces of said patterned photoresist layer; and
   following said removing portions of said reactive overcoat layer that are initially formed over top surfaces of said patterned photoresist layer, reacting remaining portions of said reactive overcoat layer on sidewalls of said patterned photoresist layer so as to chemically bind said remaining portions of said reactive overcoat layer on said sidewalls.

10. The method of claim 9, wherein said reactive overcoat layer comprises a material that is selected to catalyze a reaction with residual acid in said patterned photoresist layer.

11. The method of claim 10, further comprising forming a pretreatment layer over said patterned photoresist layer, prior to said forming said reactive overcoat layer, said pretreatment layer characterized by a solution for depositing a catalyzing material in said patterned photoresist layer.

12. The method of claim 11, wherein pretreatment layer comprises an acidic solution for enhancing a subsequent polymerization said reactive overcoat layer applied thereon.

13. The method of claim 11, further comprising completely removing portions of said pretreatment layer initially formed on said top surfaces of said patterned photoresist layer.

14. The method of claim 9, wherein said removing portions of said reactive overcoat layer initially formed over top surfaces of said patterned photoresist layer further comprises planarizing said overcoat layer to said top surfaces of said patterned photoresist layer.

15. The method of claim 14, wherein said planarizing comprises an endpoint timed etch.

16. The method of claim 14, wherein said planarizing comprises chemical mechanical polishing.

17. The method of claim 9, wherein said reacting remaining portions of said reactive overcoat layer further comprises a diffusion driven reaction.

18. The method of claim 9, wherein said thickness of said test overcoat layer is determined by an optical measurement.

19. The method of claim 10, wherein said thickness of said test overcoat layer is determined by cross sectional analysis.

* * * * *